(12) United States Patent
Chen et al.

(10) Patent No.: US 8,809,160 B2
(45) Date of Patent: *Aug. 19, 2014

(54) METHODS FOR FORMING HIGH-K CRYSTALLINE FILMS AND RELATED DEVICES

(75) Inventors: Hanhong Chen, Milpitas, CA (US); Edward Haywood, San Jose, CA (US); Pragati Kumar, Santa Clara, CA (US); Sandra G Malhotra, San Jose, CA (US); Xiangxin Rui, Campbell, CA (US)

(73) Assignees: Intermolecular, Inc., San Jose, CA (US); Elpida Memory, Inc., Tokyo (JP)

(*) Notice: Subject to any disclaimer, the term of this patent is extended or adjusted under 35 U.S.C. 154(b) by 307 days.

This patent is subject to a terminal disclaimer.

(21) Appl. No.: 13/334,618

(22) Filed: Dec. 22, 2011

(65) Prior Publication Data

US 2012/0156889 A1    Jun. 21, 2012

Related U.S. Application Data

(62) Division of application No. 12/970,835, filed on Dec. 16, 2010, now Pat. No. 8,530,322.

(51) Int. Cl.
*H01L 21/20* (2006.01)
*H01L 21/31* (2006.01)
*H01L 21/02* (2006.01)
*H01L 49/02* (2006.01)

(52) U.S. Cl.
CPC .......... *H01L 28/40* (2013.01); *H01L 21/02186* (2013.01); *H01L 21/0228* (2013.01); *H01L 28/56* (2013.01); *H01L 28/60* (2013.01); *H01L 21/02189* (2013.01)

USPC .......... 438/396; 438/397; 438/398; 438/399; 438/785

(58) Field of Classification Search
CPC ................................ H01L 28/40; H01L 28/55
USPC .................. 438/396–399, 785; 257/E29.342, 257/E29.343

See application file for complete search history.

(56) References Cited

U.S. PATENT DOCUMENTS

| | | | |
|---|---|---|---|
| 2006/0097305 A1* | 5/2006 | Lee | 257/310 |
| 2007/0102742 A1* | 5/2007 | Kil et al. | 257/295 |
| 2007/0232081 A1* | 10/2007 | Kil et al. | 438/785 |
| 2008/0093711 A1* | 4/2008 | Raaijmakers et al. | 257/638 |

* cited by examiner

*Primary Examiner* — Kevin Parendo

(57) ABSTRACT

This disclosure provides a method of fabricating a semiconductor stack and associated device, such as a capacitor or DRAM cell. In such a device, a high-K zirconia-based layer may be used as the primary dielectric together with a relatively inexpensive metal electrode based on titanium nitride. To prevent corruption of the electrode during device formation, a thin barrier layer can be used seal the electrode prior to the use of a high temperature process and a (high-concentration or dosage) ozone reagent (i.e., to create a high-K zirconia-based layer). In some embodiments, the barrier layer can also be zirconia-based, for example, a thin layer of doped or un-doped amorphous zirconia. Fabrication of a device in this manner facilitates formation of a device with dielectric constant of greater than 40 based on zirconia and titanium nitride, and generally helps produce less costly, increasingly dense DRAM cells and other semiconductor structures.

20 Claims, 9 Drawing Sheets

FIG. 3e
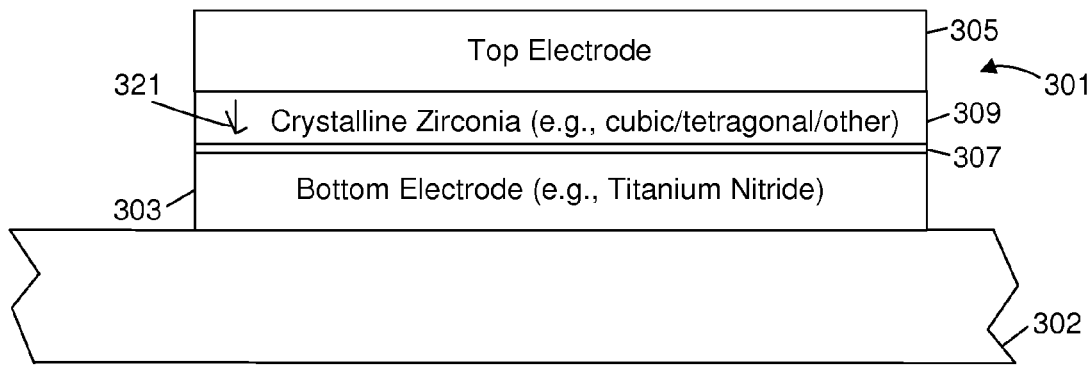
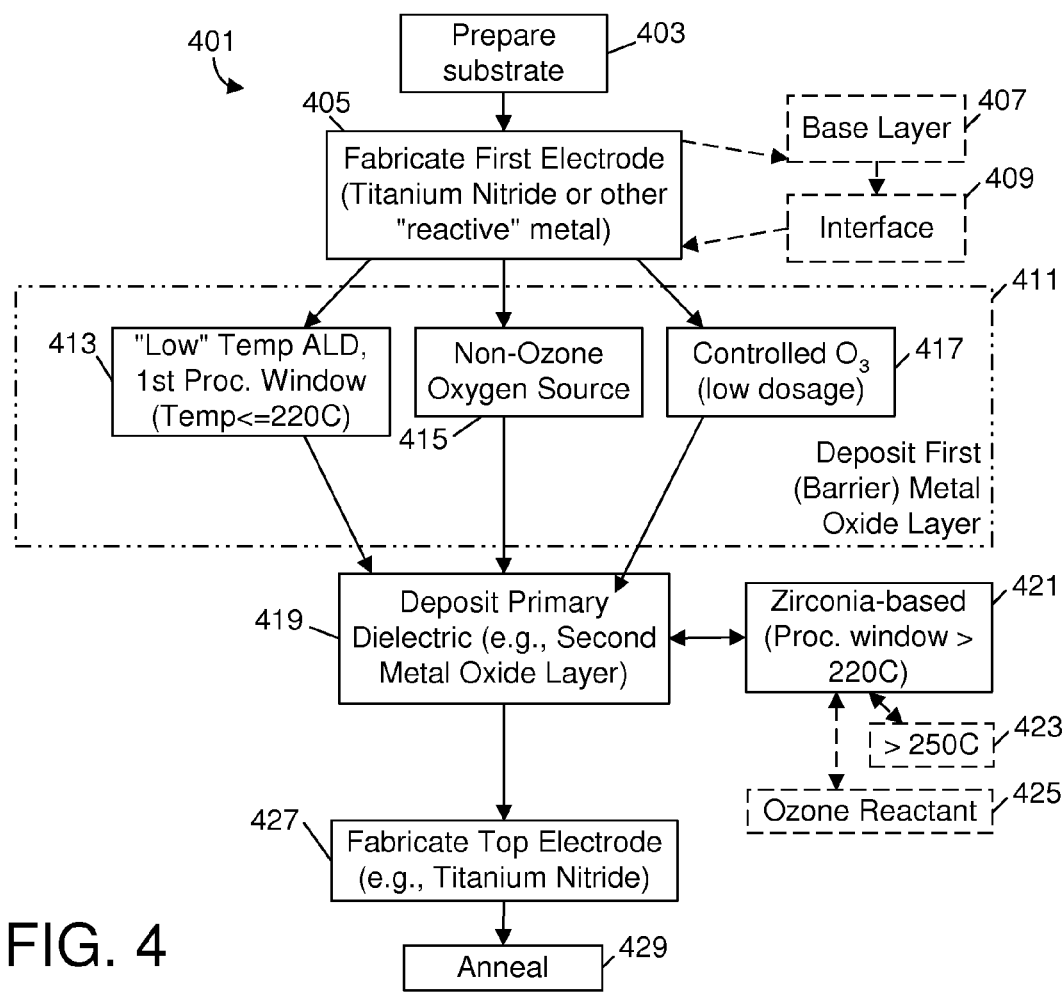
FIG. 4

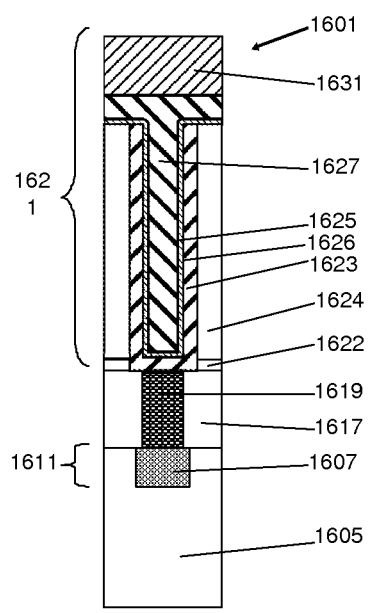
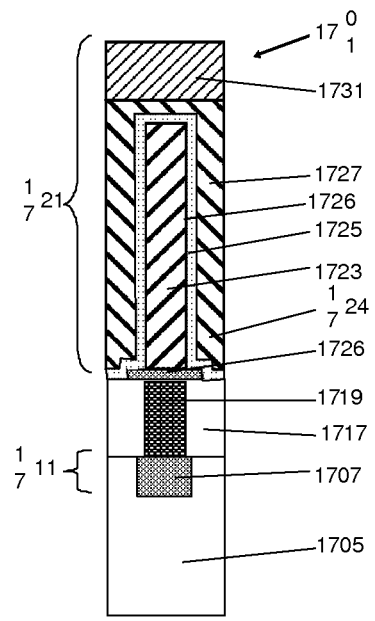
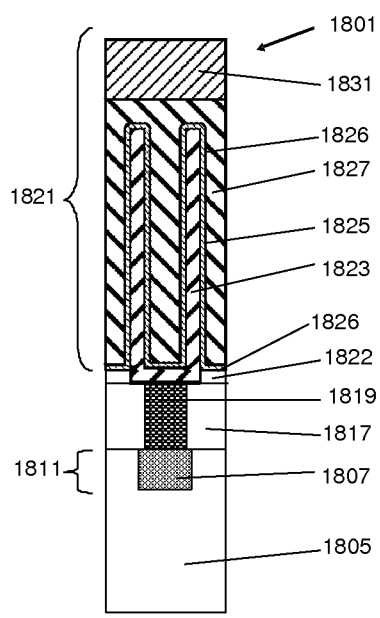

METHODS FOR FORMING HIGH-K CRYSTALLINE FILMS AND RELATED DEVICES

This document relates to the subject matter of a joint research agreement between Intermolecular, Inc. and Elpida Memory, Inc.

BACKGROUND

The obtainable density of DRAM and other semiconductor devices is strongly tied to the ability to miniaturize their component structures, among them capacitors. In turn, thinner and smaller area capacitors are obtained using high dielectric constant materials. Certain metal oxides show promising application as these high dielectric constant materials, but these metal oxides can vary greatly in terms of obtainable and reproducible dielectric constant. What is more, some of these oxides can produce greater charge leakage than other materials, which becomes an increasingly important consideration as the layer size and capacitor size shrink. In order to produce higher density capacitors and other semiconductor devices, it is desired to have designs based on high dielectric constant, low leakage (i.e., low effective oxide thickness) materials.

Zirconium oxide ($ZrO_2$) has been used as a capacitor dielectric in some designs, typically in substantially amorphous form, heavily doped with aluminum to help suppress leakage. However, as process technologies become increasingly small, the dielectric constant and equivalent oxide thickness ("EOT") provided by this zirconia-based film are not sufficiently robust. The use of amorphous as opposed to crystalline films and the conventional use of an aluminum dopant can limit these parameters to the point where amorphous zirconium oxide can be unsuitable for process technologies below 60 nanometers.

A need therefore exists for ways to effectively produce high dielectric constant zirconium oxides; ideally, such methods could be inexpensively implemented in a manufacturing context; this would lead to consistently higher dielectric constant and low leakage, and therefore greater, reproducible device density. The present invention addresses these needs and provides further, related advantages.

BRIEF DESCRIPTION OF THE DRAWINGS

FIG. 2 provides an overview used to introduce a number these embodiments.

FIGS. 3a-3e collectively illustrate a process for forming a MIM stack 301.

In particular, FIG. 3a illustrates a substrate 302 upon which a bottom electrode 303 has been deposited.

FIG. 3b shows the MIM stack from FIG. 3a, but with a barrier layer 307 added to cover the electrode.

FIG. 3c shows the MIM stack from FIG. 3b, subjected to the use of subsequent deposition and/or heating processes (represented by numerals 319 and 321, respectively).

FIG. 3d shows the MIM stack from FIGS. 3a-c, but with a second metal oxide layer added, 309, to serve as the primary dielectric layer. As represented by lattice symbol 321, the second metal oxide layer may be crystalline. Also, distance measures "D1" and "D2" represent that (for many embodiments) the second metal oxide layer 309 is substantially thicker than the barrier layer 307, e.g., 4× as thick or 4× greater than the barrier layer.

FIG. 3e illustrates the completed MIM stack 301, and also denotes some optional process and device characteristics. In particular, the addition of a top electrode 305 allows the stack to function as a capacitor, as part of a dynamic random access memory ("DRAM") cell, a DRAM array, or a component of another device. The bottom electrode may optionally be formed partially or entirely from titanium nitride ("TiN"), while the second metal oxide layer may be optionally formed from a crystalline zirconium oxide, undoped or doped with aluminum oxide, yttrium oxide, germanium oxide or magnesium oxide (e.g., cubic, tetragonal or mixed "high-K" form of zirconia).

FIG. 4 shows one methodology for fabricating a structure such as the one seen in FIG. 1 and FIGS. 3a-e. In particular, three branches, represented by processes 413, 415 and 417, represent alternatives for producing a specific barrier layer. As represented by a process 429, an anneal process completes this methodology, irrespective of branch, to produce a finished metal-insulator-metal ("MIM") stack.

C., 250° C., 275° C. and 300° C.), each as a function of ozone reagent concentration. FIG. 9 indicates that as temperatures and ozone dosing become higher, the TiN electrode is increasing oxidized as part of the metal oxide formation process (with the consequence of, as mentioned earlier, degraded performance in the finished device). FIG. 9 suggests that low ALD process temperatures and/or low ozone dosing help minimize Ti—$O_x$—$N_y$ oxide formation.

FIG. 10 helps demonstrate that the presence of the barrier layer insulates effects of high ozone dosing from the underlying TiN electrode, and this implies that both high ozone dosing and high temperatures may be employed when the barrier layer is present, i.e., without substantially corrupting the TiN layer.

FIGS. 16-18 respectively illustrate memory cells including different capacitor configurations.

FIG. 16, in particular, illustrates a memory cell 1601 including a cylinder-shaped capacitor 1621.

FIG. 17 illustrates a memory cell 1701 using a pillar- or pedestal-shaped capacitor 1721.

FIG. 18 illustrates a memory cell 1801 using a crown-shaped capacitor 1821.

Figure 1:
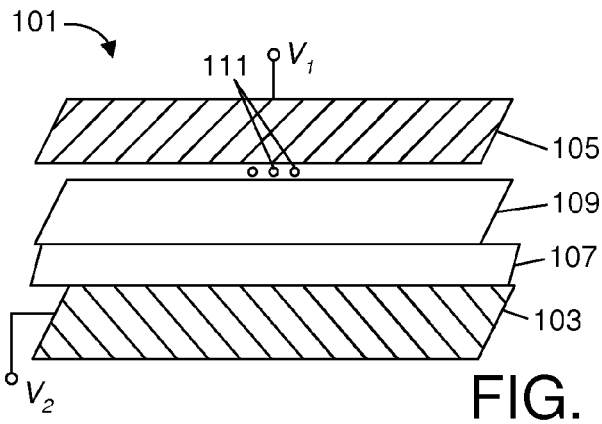
FIG. 1 is an illustrative diagram that shows a metal-insulator-metal ("MIM") stack 101, configured as a capacitor. The depicted stack includes a bottom electrode 103, a top electrode 105, a barrier or barrier layer 107 and a primary metal oxide layer 109. In certain more detailed embodiments, the barrier 107 may also be a metal oxide layer, as will be further explained below.

The invention defined by the enumerated claims may be better understood by referring to the following detailed description, which should be read in conjunction with the accompanying drawings.

DETAILED DESCRIPTION

This disclosure generally provides methods for fabricating high dielectric constant films (or layers), and related stacks and capacitors, and devices based on these films (e.g., capacitors at a small scale, and high density memory chips and integrated circuits at a larger scale).

In one implementation, devices may be fabricated to have a high dielectric constant ("high-K") metal oxide layer. To prevent reaction between materials used to form this high-K layer and an underlying electrode, a barrier layer is first deposited above the electrode, thereby enabling the use of the reactive process to fabricate the high-K layer above the barrier layer without corrupting the underlying electrode; by "reactive," it is meant that the deposition techniques are more aggressive than those used to form the barrier layer, for example, techniques involving high doses of ozone, high temperature, or both of these things. The barrier layer inhibits corruption of the underlying electrode by the process and/or materials used in the reactive process; if left unchecked, such corruption could limit obtainable dielectric constant or otherwise increase leakage.

In one optional embodiment, the barrier layer may be a thin layer produced using a low temperature process or a process that presents less likelihood of corrupting the underlying electrode. The use of a relatively low temperature, less corruptive process materials, or both, permits the fabrication of a first, thin metal oxide layer as this barrier layer, with the high-K layer (e.g., a second metal oxide layer) formed thereafter. Although not required, if desired, a primary metal for the first metal oxide layer may be the same metal, as the primary metal for the second metal oxide layer, e.g., zirconium. In another optional embodiment, the electrode may consist partially or entirely of titanium nitride (TiN), with the barrier layer preventing TiN corruption during fabrication of the high-K film(s). In still another optional embodiment, the high-K film or layer may have a substantial contribution from crystalline zirconia, such as cubic zirconia, tetragonal zirconia, or both. The zirconia could be undoped or doped with aluminum, germanium, yttrium or magnesium. A relatively high temperature window may be used to fabricate these crystalline materials (e.g., if desired, using a different process window, different materials, or both, than were used to form the barrier). As mentioned, the barrier layer may be made relatively thin, depending on design, for example, between 0.5 and 2.0 nanometers ("nm").

It should be appreciated that for the embodiments presented below, this disclosure provides methods for effective formation of high-K zirconia-based films together with a metal nitride electrode through the use of a thin barrier, that is, in a manner which inhibits oxidation of titanium nitride during the fabrication process.

This disclosure also provides several optional methodologies for fabricating a device based on these materials, such as a capacitor, dynamic random access memory ("DRAM") cell or integrated circuit ("IC"). In particular, an atomic layer deposition ("ALD") process based on one or more zirconium precursors can have process window(s) chosen for specifically-desired device characteristics. In one embodiment, a thermal process (i.e., a relatively "hot," thermally regulated process) can be applied by heating a substrate to a desired temperature. The process may use an oxygen source to react with a zirconium precursor during heating so as to form the desired form of zirconia in-situ. Such a source of oxygen may be ozone, with the barrier layer inhibiting reaction between an underlying electrode (e.g., TiN) with the zirconium precursor or with a component of a reaction involving the zirconium precursor (e.g., it may inhibit a reaction between TiN and ozone). These and other optional design features will become apparent from the description below.

Notably, the term "MIM" as used herein should be understood to encompass any combination of layers that utilize a dielectric with two electrodes, whether or not additional layers are present; for example, the term "MIM" should be understood to encompass metal-insulator-insulator-metal, metal-insulator-insulator-insulator-metal, metal-insulator-metal-insulator-metal and other, similar structures, with or without further insulators, enhancement layers, smoothing or adherence layers or other structures between them. An oxide "layer" (whether used in the context of part or all of an electrode or the dielectric) should be understood to refer to either (a) an entire layer, which may consist of a single layer or one or more "monolayers" that together cooperate to form an oxide layer, as well as (b) individual monolayers, e.g., an oxide of titanium, yttrium/aluminum, or both. Thus, a "layer" may refer to a single layer, to an aggregate combination of layers, or to one monolayer. The term "nanolayer" refers to a thin deposition that may achieve sparse or complete layer coverage—for example, a single ALD cycle may be used to deposit a nanolayer. The "substrate" may be any material capable of supporting a layer of semiconductor material, and may include a metal conductor, insulator, glass, previously deposited layer (dielectric, or otherwise) or another material, but generally in this disclosure will refer to a metal electrode mounted above a $SiO_2$ or other base. "Preparation," "treatment" or "pretreatment" of a layer typically includes cleaning or oxidizing a substrate to promote good adhesion between a to-be-deposited layer and the substrate, and to otherwise ready the substrate's surface for a semiconductor deposition; in the context of the discussion below, this term is also used to encompass scrubbing under pressure to render the surface somewhat abrasive, i.e., to scratch or roughen the surface. It should also generally be noted that when the term "ozone" is used in this disclosure, it is being used not to necessarily require "pure, 100%" ozone—that is, generally speaking, ozone is typically not used in pure form, i.e., it is typically mixed with other gasses such as oxygen in an approximately ⅕ ratio. Such a mixture is typically the instantiation of "ozone" in the specific processes advanced by this disclosure. Also, it should be understood that the various atomic ratios expressed in this disclosure are approximate but may vary and may encompass both varying stoichiometry and non-stoichiometric compounds; without limiting this principle, as used herein, $MO_x$ and $MO_x$ (i.e., where "x" is used as a subscript) should both be understood to refer to oxides of a metal "M" of unknown stoichiometry, e.g., encompassing both multiple different ratios (e.g., $NiO$, $NiO_2$) as well as varying integer or non-integer ratios (e.g., $NiO_{0.95-1.95}$). Finally, the expression "primary" constituent or "primary" metal should be understood to refer to a constituent or metal (as appropriate) that is present in terms of composition in greater amounts than any other single constituent or metal (as appropriate).

FIG. 1 introduces a semiconductor stack or assembly 101. The stack is seen to consist of a first or bottom electrode (or "BEL") 103 and a second or top electrode (or "TEL") 105, each connected to a respective voltage terminal ($V_2$ or $V_1$, respectively). One or more layers 107 and/or 109 in between the electrodes act as a dielectric. The assembly 101 is therefore in this example a capacitor, that is, a structure that will store charge between the two electrodes, with the charge decaying over time as influenced by the dielectric constant of the device (e.g., by the dielectric constant of the dielectric layers 107 and/or 109), leakage characteristics of the device, and other factors. The capacitor formed by assembly 101 may be used as a standalone component, or as part of a larger component such as a DRAM cell, memory array, or integrated circuit ("IC"), e.g., as part of an array of many millions of DRAM cells. As indicated by ellipses 111, other layers may optionally be included in between the depicted layers of the assembly; for example, current steering layers, smoothing layers, adherence layers and other types of materials may also be employed in the assembly to serve a myriad of optional purposes. To provide one specific example, a current steering layer such as a diode may be used to impart particular voltage characteristics.

It was mentioned that one of or both of layers 107 and 109 may act as a dielectric. In the embodiment of FIG. 1 and in the embodiments discussed below, layer 107 is a barrier layer and layer 109 is a primary dielectric, that is, the layer primarily relied upon to give the assembly 101 an associated dielectric constant. In some embodiments, the barrier layer may be formed of a metal oxide, that is, it may be an insulating material with a dielectric constant also, and may therefore partially contribute to the dielectric properties of the assembly 101.

Figure 2:
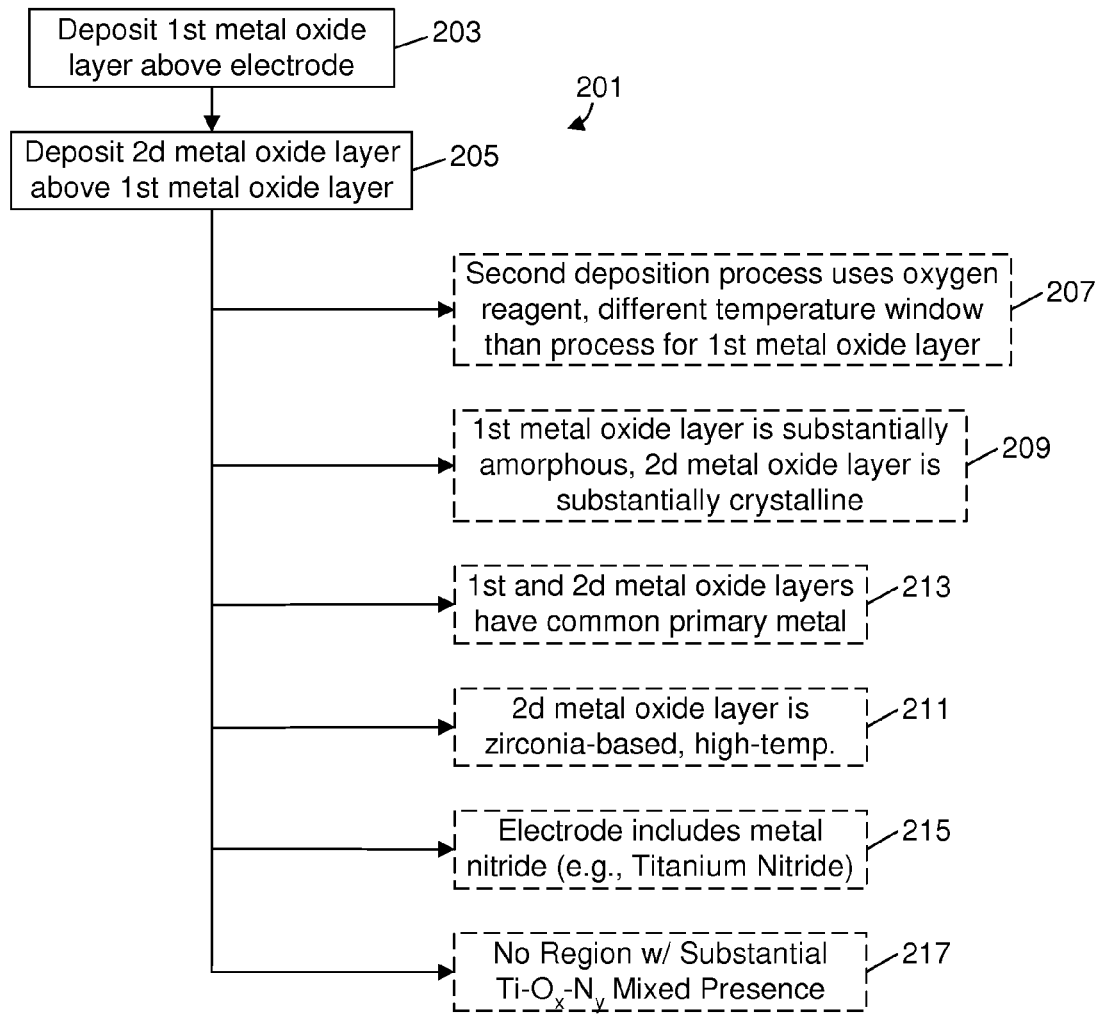
FIG. 2 presents an overview 201 of several different methodologies for fabricating a semiconductor stack or assembly. In particular, first and second metal oxide layers can be deposited over an electrode, as depicted by reference numerals 203 and 205, respectively. A number of dashed-line functional boxes, 207, 209, 211, 213, 215 and 217, illustrate optional process or device characteristics represented by some of the embodiments.

FIG. 2 helps introduce processes used to fabricate the device of FIG. 1; FIG. 2 also provides further introduction to some expressly-contemplated process variations and variations of the structure of FIG. 1.

In particular, a semiconductor assembly is formed using an electrode which has been deposited on a substrate, for example, a surface of silicon dioxide. Because it is serving as a foundation for the deposition, this electrode will typically be referred to as the bottom electrode or BEL. A deposition process 201 first deposits a first metal oxide above this electrode, per process step 203. The first metal oxide as just mentioned may act as a barrier layer and facilitate the deposition of a second metal oxide that will serve as a primary dielectric layer, per process step 205. Although not expressly indicated in FIG. 2, the process 201 may involve further deposition of a top electrode or other layers, as has previously been introduced, thereby optionally configuring the stack for duty as a capacitor. Because the barrier layer includes a metal oxide in this embodiment, it also functions as a dielectric layer; however, it is typically relatively thin, and it typically does not act as the dominant contributor to the dielectric constant of the assembly.

Dashed-line boxes in FIG. 2 indicate optional process characteristics. For example, as identified by reference numeral 207, the second metal oxide layer can involve a different ("second") deposition process than was used for the first layer. This second process can be based on an oxygen-contained reagent, for example, ozone, and can if desired involve a different temperature window than a process used for the first metal oxide layer. As these statements imply, some high-K films are most easily formed using ozone and a high temperature window, for example, high ozone doses, a relatively high temperature (e.g., 260-300° C.) and a proper choice of precursor. The first metal oxide layer helps prevent corruption of any underlying electrode by some or all of these processes and materials. In a second embodiment, as referenced by numeral 209, the first metal oxide layer can be substantially amorphous, while the second metal oxide layer may have at least some contribution from a crystalline metal oxide. If zirconium forms the basis for both of these oxides, the first metal oxide layer may formed using a traditional "cool" process to form zirconia (e.g., low-K zirconium oxide) which then acts as a barrier permitting the formation of different structure zirconia (e.g., cubic, tetragonal or another form of high-K zirconia) using more aggressive process parameters as appropriate. For example, it is believed that more aggressive process parameters can be used to form high-K lattice-structures (e.g., cubic or tetragonal zirconia formed using a high temp process, as indicated by reference numeral 211). In some embodiments, e.g., per numeral 213, the second metal layer may if desired be a thin layer formed of the same primary metal as the first ("barrier") metal oxide layer, though this by no means is a requirement for all implementations. By "thin," is it meant that the first metal oxide layer is less than about 20-25% of the thickness of the second metal oxide layer, e.g., 0.5 to 2 nm. Finally, in some embodiments, the bottom electrode may be a metal nitride (e.g., per reference numeral 215), with an interface layer between the electrode and the dielectric layer(s) characterized as a region with no substantial Ti—$O_x$—$N_y$ presence, per numeral 217.

FIGS. 3a-3e provide additional process detail regarding the fabrication of a semiconductor assembly. In particular, FIGS. 3a-3e show formation of an assembly 301 that will become a MIM stack. In FIGS. 3a-3e, like reference numerals refer to the same element, i.e., the assembly/MIM stack is designated using reference numeral 301 irrespective of stage of formation (that is, irrespective of the particular FIG).

Figure 3A:
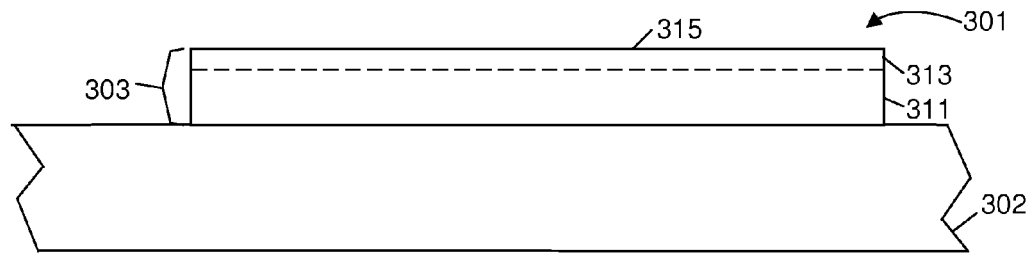

FIG. 3a illustrates a substrate 302 upon which a bottom electrode or BEL 303 has been deposited. As alluded to earlier, this electrode may have materials that react relatively easily during subsequent process steps. For example, the electrode may be partially or completely formed using a metal nitride, such as titanium nitride. In one embodiment, the metal nitride can form substantially the entire electrode 303 and, in another embodiment, the metal nitride can substantially make up one layer 313 with the electrode being a composite with this layer 313 and another conductive layer 311. Irrespective of the specific materials used, it should be assumed the electrode presents a surface 315 with the propensity to react with other process materials that will later be used to fabricate the remainder of the MIM stack.

Figure 3B:
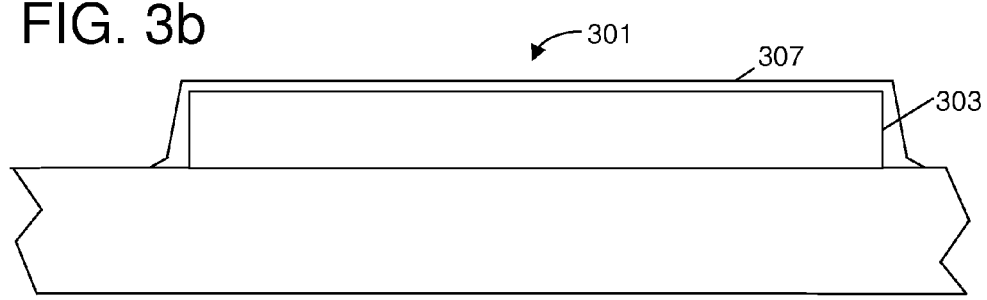

FIG. 3b shows the assembly from FIG. 3a, but with a barrier layer 307 added to cover the electrode. FIG. 3b illustrates this barrier layer as completely covering (e.g., sealing) the bottom electrode 303, but this need not be the case for all embodiments. As mentioned above, this first barrier layer can be a metal oxide layer (e.g., a layer primarily based upon a metal oxide). The barrier layer 307 helps prevent reaction of the bottom electrode 303 during subsequent process steps.

Figure 3C:
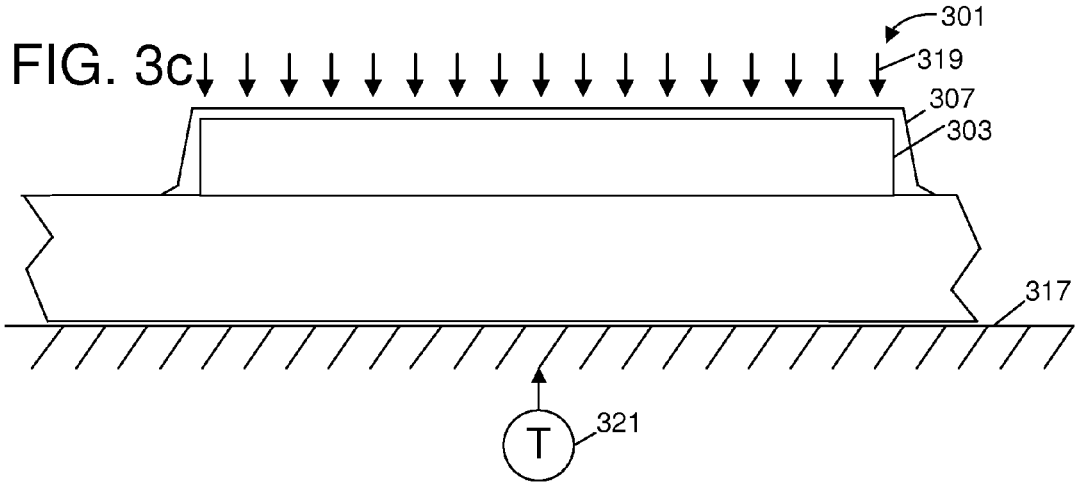

These process steps and/or materials are graphically depicted in part by FIG. 3c, which shows the assembly 301 with an added depiction that the assembly is mounted above a pedestal 317. In a reactive process (e.g., during an ALD or other process used to deposit metal oxide layers), the assembly may be subject to some type of interaction that could cause corruption of part or all of the electrode layer 303. For example, the assembly may be subjected to deposition materials and/or processes, graphically represented by arrows 319, or by process temperature, for example, as introduced by pedestal or other temperature control 321, that would cause this type of interaction. For TiN in particular, it has been found that exposure of TiN to ozone at either high doses and/or temperatures above about 220° C. causes the formation of Ti—$O_x$—$N_y$, a low-dielectric constant, relatively leaky material that could degrade both capacitor performance and device reproducibility (i.e., consistency). Unfortunately, for zirconia in particular (i.e., for zirconia oxide), the crystalline forms, which have higher dielectric constant are typically easily produced with process temperatures well above 220° C. as well as relatively high ozone dosing. The presence of the barrier layer 307 permits the use of high ozone dosing and/or high temperatures in a manner that minimizes the formation of Ti—$O_x$—$N_y$, and thus, in a manner that facilitates higher dielectric constant, lower leakage and greater reproducibility.

"Typical" dielectric constant values for various forms of zirconia are given below. Importantly, while only zirconium oxide forms are listed below, it should be appreciated that various other metal oxides may also be used (information regarding relative dielectric constant, leakage and other factors for these other materials is readily available on the web and otherwise to one of ordinary skill in the art). That is to say, while the embodiment of FIG. 3c is explained with reference to zirconia, the principles expressed herein can be extended to other dielectric materials that are not based on or that do not have zirconia.

TABLE 1

| Zirconia Form | Typical Dielectric Constant |
|---|---|
| Amorphous | 19 |
| Monoclinic | 22 |
| Cubic | 37 |
| Tetragonal | 47 |

As implied, FIGS. 3a-3c represent the formation of the assembly (301) using a semiconductor deposition process, for example, ALD. It should be appreciated that if the barrier layer is formed in a manner that is consistent with the process used to deposit the primary dielectric layer, then one basic deposition process or system can be used to fabricate the entire assembly, that is, a completed MIM stack. The process depicted by FIGS. 3a-3e can facilitate exactly this end, e.g., the barrier layer and the primary dielectric may both be formed using "similar" ALD processes, for example, with a common precursor in an ALD process. In one embodiment, the same precursor could be used to form each of the barrier layer and the primary dielectric layer; in another embodiment, the precursors may be different chemicals that form respective layers to have different crystalline phases of the same oxide, different oxides rooted in the same common metal, or different oxides founded on different primary metals. For example, each of the barrier layer and the primary dielectric layer may be formed to have zirconium as a common primary metal; alternatively, a completely different material not rooted in zirconium may be used to form the barrier layer. In the context of FIG. 3c, temperature control (depicted using numeral 321) may optionally use a first, low-temperature window to form the barrier layer (e.g., with the barrier layer 307 formed from doped or undoped amorphous zirconium oxide) and second, high temperature window to form the second metal oxide layer or primary dielectric. Use of a common precursor for these processes can help simplify process and cost, while separate precursors may be chosen if optimal to distinct temperature windows.

Figure 3D:
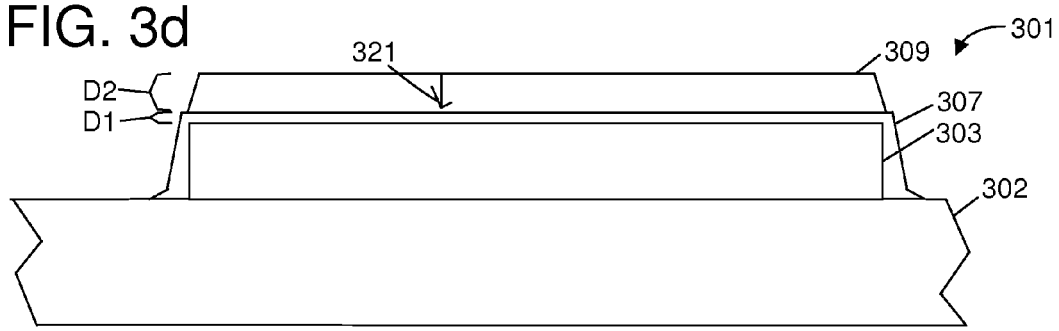

FIG. 3d shows the assembly 301 taken one step further into the process, that is, with the second metal oxide layer or primary dielectric layer 309 now deposited above (i) the substrate 302, (ii) the bottom electrode 303, and (iii) the barrier layer 307. The second metal oxide layer 309 is seen as overlaid with a lattice symbol 321, to depict that this layer optionally can have lattice characteristics that promote a high dielectric constant, low leakage, or otherwise desirable parameters for a completed MIM stack. It should be noted that such a lattice structure is not required, e.g., a high-K amorphous zirconia film may also be used, for example, using a high-ozone process, with the barrier present to prevent corruption of the underlying electrode. FIG. 3d also shows two depth markers, "D1" and "D2," which are respectively used to indicate thickness of the first and second metal oxides. In this regard, because the first metal oxide serves a primary purpose of acting as a barrier to prevent electrode corruption, it preferably is only "just thick enough" to prevent that corruption, and then yields to a higher dielectric constant material to facilitate the thinnest (and most efficient) MIM stack possible. As previously mentioned, D2 (the thickness of the primary dielectric) is typically a minimum of 4 times thicker than the thickness of the barrier layer (D1); in one embodiment, D2 may be on the order of 5-10 nm, while D1 is between 0.5 and 2.0 nm. That is to say, because the primary dielectric has a better dielectric constant, it ideally makes up as large a percentage as possible of the overall dielectric materials, with the barrier layer being just thick enough to do its job. Naturally, these numbers represent just one exemplary case.

FIG. 3e shows a completed MIM stack based on the assembly 301. Assuming the materials and processes quoted above, this assembly includes a substrate 302, a bottom electrode layer made partly or completely of TiN 303, a top electrode 305, a thin barrier layer 307, and a relatively thicker primary dielectric layer 309. The thin barrier layer may be amorphous zirconia, while the primary dielectric can be primarily constituted of crystalline zirconia (e.g., cubic and/or tetragonal zirconia), as designated once again by lattice symbol 321. Although the top electrode 305 does not have a material indicated, it can be formed of the same material as the bottom electrode (e.g., TiN) or another conductive material. Depending on process, deposition of the top electrode after formation of the dielectric layers (e.g., after use of ozone-based processes) will not present the same corruption issues as existing previously in the process, and thus use of another barrier layer in connection with the top electrode layer while optional is not required.

With the principle process variations and structures thus introduced, this disclosure will now elaborate upon specific processes and materials used to form a one MIM stack, where the bottom electrode is based in TiN, the barrier is amorphous zirconia, and the primary dielectric is high-K zirconia (e.g., amorphous high-K or crystalline zirconia). Process considerations are explained with reference to FIGS. 4-13.

FIG. 4 provides a flowchart that illustrates a basic atomic layer deposition ("ALD") fabrication process 401, and several optional steps, for forming a semiconductor layer assembly. Notably, ALD represents one fabrication process found suitable for producing the structures contemplated by this disclosure, but other deposition processes may also be used, such as sputtering and other physical vapor deposition process ("PVD"), chemical vapor processes ("CVD") and any other technique found suitable to producing the structures contemplated herein.

A silicon substrate is first prepared, as indicated by numeral 403. Preparation can consist of a cleaning process, such as for example using an ozone scrubbing process to remove any surface contaminants. The first electrode is then fabricated as the BEL, per numeral 405. As indicated above, it should be assumed that the BEL presents a material that may be corrupted by subsequent fabrication steps, e.g., subsequent steps needed to create a dielectric or dielectric interface that will provide superior high-K, leakage, or EOT properties. In this example, TiN is used because it provides an excellent, low-cost conductor with known properties; however, TiN unfortunately may be corrupted (e.g., oxidized) by subsequent steps used to finish a MIM stack device, that is, if the process is not appropriately controlled or designed. As represented by dashed line optional processes 407 and 409, the BEL may be fabricated to have a base layer that is different from the material that provides the dielectric interface. As part of the electrode fabrication process, one of three basic alternate "branches" can be employed to fabricate a barrier layer that will protect the BEL during fabrication of the dielectric (a process generally referred to by block 411). First, as indicated by numeral 413, a "low" temperature ALD process window can be used to fabricate the barrier layer; it was earlier mentioned that high process temperatures can facilitate reaction of TiN and ozone to form Ti—$O_x$—$N_y$, so if the ALD process window is kept suitably low, the formation of this undesired material can be minimized, and the TiN layers "sealed" or otherwise covered to prevent reaction with oxygen during later process steps. Second, as indicated by numeral 415, a source of oxygen that is less reactive than ozone may also be used to fabricate the barrier, with or without precise temperature control—that is to say, other oxygen sources (such as without limitation water and oxygen gas, $O_2$) are far less reactive than ozone at equivalent doses. An ALD process that therefore uses an alternative source of oxygen, less reactive than ozone, may also function to create a barrier layer without any substantial formation of Ti—$O_x$—$N_y$. Finally, as indicated by numeral 417, it may also be possible to form the barrier layer using very low doses of ozone ($O_3$), with the exact dosing empirically determined again to prevent any substantial formation of Ti—$O_x$—$N_y$ during barrier layer fabrication or any subsequent process steps.

Once the barrier layer has been deposited, again, without substantial Ti—$O_x$—$N_y$ formation, the primary dielectric layer (e.g., a second metal oxide layer), may then be deposited, as indicated by numeral 419. With the barrier layer in place, a number of otherwise unsuitable processes may be used to fabricate a high-K primary dielectric layer. For example, it was earlier mentioned that in conventional devices, amorphous zirconia with aluminum doping has been used to form a dielectric, but that this material presents issues as process technologies continue to shrink. With the barrier layer, it becomes easier from a process standpoint to use high-K zirconia as the primary dielectric, e.g., with up to double the dielectric constant of conventional zirconia forms and better EOT characteristics; simply put, the use of the barrier layer together with high-K zirconia films facilitates continued reliance on smaller, inexpensive zirconium oxide devices.

It should be noted here that this discussion does not preclude the use of doping; Yttrium (Y), magnesium (Mg), germanium (Ge), aluminum (Al) and other materials may be used to improve leakage, dielectric constant or other layer parameters for either of or both of the barrier layer and the primary dielectric layer. For example, as indicated doping (e.g., aluminum) may be used as a barrier layer dopant up to approximately 20% of overall metal contribution for the barrier layer (e.g., 80% zirconium, 20% aluminum metal contribution to the metal oxide in the layer); for the primary dielectric layer, similar doping may be used, although here it is believed that the dopant should be kept below approximately 10% total metal contribution so as to maximize crystallinity of the resultant layer. It is well within the skill of one familiar with materials science to vary these parameters so as to devise suitable combinations of materials and/or dopants using the principles set forth above.

A number of fabrication options previously introduced are further highlighted in FIG. 4; for example, as indicated by numeral 421, the zirconia-based primary dielectric may be fabricated using an ALD process window substantially above about 220° C. (as will be seen below, this value the temperature at which TiN begins to react with ozone and other oxygen sources to form Ti—$O_x$—$N_y$). In fact, as indicated by dashed-line (optional) boxes 423 and 425, an ALD process window of greater than 250° C. may be chosen (e.g., 260-300° C.), and an ozone reagent may also be used (with relatively high ozone dosing if desired). These process parameters facilitate the formation of high-K, crystalline zirconia, under circumstances where substantial levels of Ti—$O_x$—$N_y$ might otherwise form, that is, absent suitable controls. With the dielectric layers thus added to the assembly, the top electrode can be added, per processes 427, and the entire assembly can be subjected to an anneal, as indicated by numeral 429, to improve the crystallinity of the dielectric.

ALD refers to a process used to deposit conformal layers with atomic scale thickness during semiconductor processing operations. ALD may be used to deposit barrier layers, adhesion layers, electrode layers, seed layers, dielectric layers, conductive layers, etc. ALD is generally regarded a multi-step, self-limiting process in the sense that a reaction terminates once a transferred material is consumed by the one or more reagents. Generally, a first material is first introduced into a processing chamber and adsorbed to a substrate. Excess material is then purged or pumped away, as appropriate, and then a second material is then introduced into the chamber, to react with the first material. Formation of a reacted film or monolayer using the aforementioned steps constitutes one deposition (or ALD cycle), and the process can then be repeated as necessary to form additional monolayers, with the number of cycles (and number of atomic layers) determining the film's total thickness. The ALD can be used to deposit each of the electrode and the dielectric, as well as the other stack layers referenced above.

Figure 5:
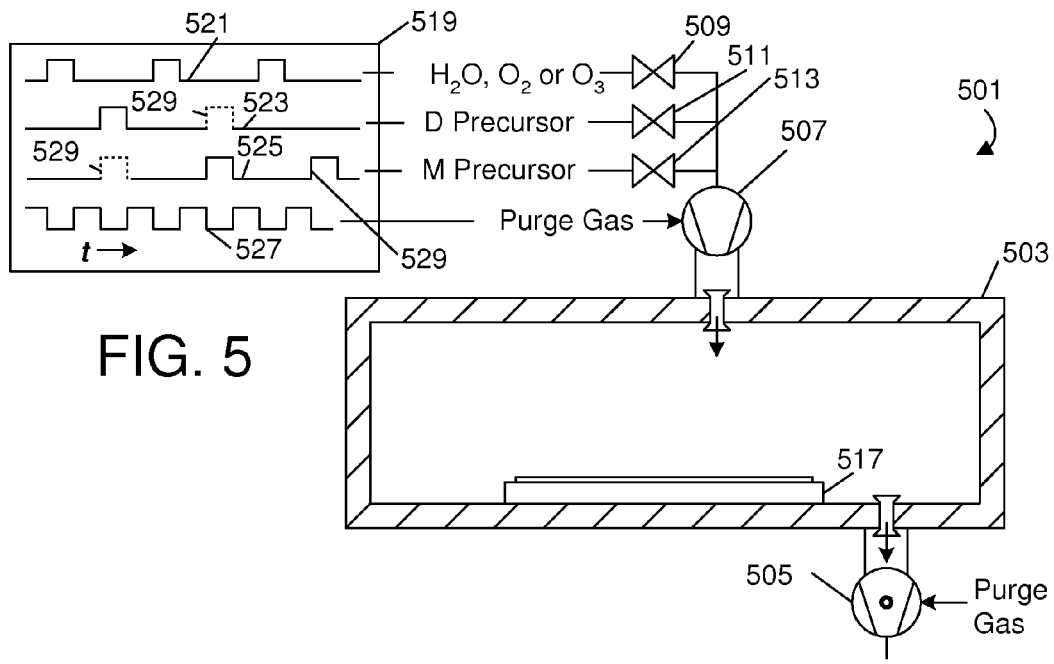
FIG. 5 shows an atomic layer deposition ("ALD") chamber, which provides one mechanism for building a structure seen in FIG. 1 or FIG. 3e.

FIG. 5 presents a schematic 501 of an ALD chamber and an associated timing graph 519 that may be used to create oxide monolayers of a metal oxide, a dopant oxide or each of them. While discussed in the context of deposition of a dielectric layer, it should be understood that the same basic principles apply to fabrication of other layers as well (e.g., a suitable electrode material, adherence layer, current steering layer, etc.). FIG. 5 shows a reaction chamber 503 having an evacuation pump 505 and an inlet 507, to introduce precursors and reagents into the chamber. Three valves, 509, 511 and 513 are depicted to each respectively supply a reagent (e.g., vaporized water, oxygen or ozone), a dopant precursor or a zirconium precursor, as controlled by software. Each gas is selectively introduced into the chamber and forms a self-saturating layer as it flows over the substrate, which may be mounted on a suitable holder or pedestal 517 and, if desired, may be rotated or otherwise robotically manipulated during deposition or between cycles.

The timing diagram presented at the left-hand side of FIG. 5 shows relative timing pulses that may be used in one embodiment to fabricate oxide layers of titanium and a dopant (i.e., assuming it is desired to create a doped titanium oxide). In particular, a first waveform 521 represents the timing of reagent pulses, e.g., ozone ($O_3$), oxygen gas ($O_2$), vaporized water, or some other material, as mentioned above. Second and third waveforms, 523 and 525, respectively represent the operation of control valves 511 and 513 to supply primary metal (M) and dopant (D) precursors (e.g., as organometallics). Finally, a final waveform 527 represents a digital control over the purge gas functions, used to control both the injection and evacuation pumps (505 and 507). The process depicted in FIG. 5 may be used to introduce organometallics deposited together or sequentially without an intervening reagent and/or purge cycle. Solid lines 523 and 525 indicate the use of a sequential introduction of organometallics, for example, to deposit distinct layers of a primary metal (e.g., as a metal oxide) and a dopant (e.g., a dopant metal oxide, if desired) alternating between these materials to thereby build up an aggregated oxide (or other material) layer, e.g., via forty or more cycles; alternatively, as indicated by dashed line pulses 529, injection of organometallics into the deposition chamber may in some embodiments be simultaneous, so as to deposit a number of $M\text{-}O_x$, $D\text{-}O_x$ or $M\text{-}D\text{-}O_x$ monolayers. Generally speaking, the use of a dopant is not strictly required, and depending on desired implementation, a layer may be fabricated using a primary metal oxide. Generally speaking, each monolayer in these embodiments can be expected to be on the order of about ½ Angstrom thick, such that forty layers would produce an oxide layer approximately two nanometers thick. Typical oxide layers can be expected to be at least this thick, with a conventional range being on the order of 4-12 nanometers thickness.

FIG. 5 illustrates that, if desired, a sequence of monolayers may be deposited by introducing a metal precursor, an oxygen source, a dopant precursor, an oxygen source, a metal precursor, an oxygen source, and so-on, in a repeating manner, to deposit $MO_x$ with occasional depositions of a dopant oxide, with intervening purge or other cycles as necessary. As alluded to earlier, dopants such as aluminum oxide may also, if appropriate to the layer, be employed, and the ALD process may also be used to deposit the electrode layers or their base materials as has been previously described. For example, in depositing a barrier layer, a relatively "low" temperature process window may optionally be employed, with interleaved layers of zirconium oxide and aluminum oxide (e.g., a monolayer of aluminum oxide interspersed once for every n layers of zirconium oxide, or using a simultaneous combination of precursors, one for zirconium and one for aluminum in different doses, are simultaneously reacted). Other materials may also be used for the barrier, as mentioned, such as $HfO_x$ and $TiO_x$. A subsequent deposition of a primary dielectric (e.g., zirconia, in a high-K process) may rely on simply a zirconium precursor (e.g., a high temperature window precursor). Many alternative materials may also be used dependent upon the desired device characteristics and desired source materials.

Figure 6:
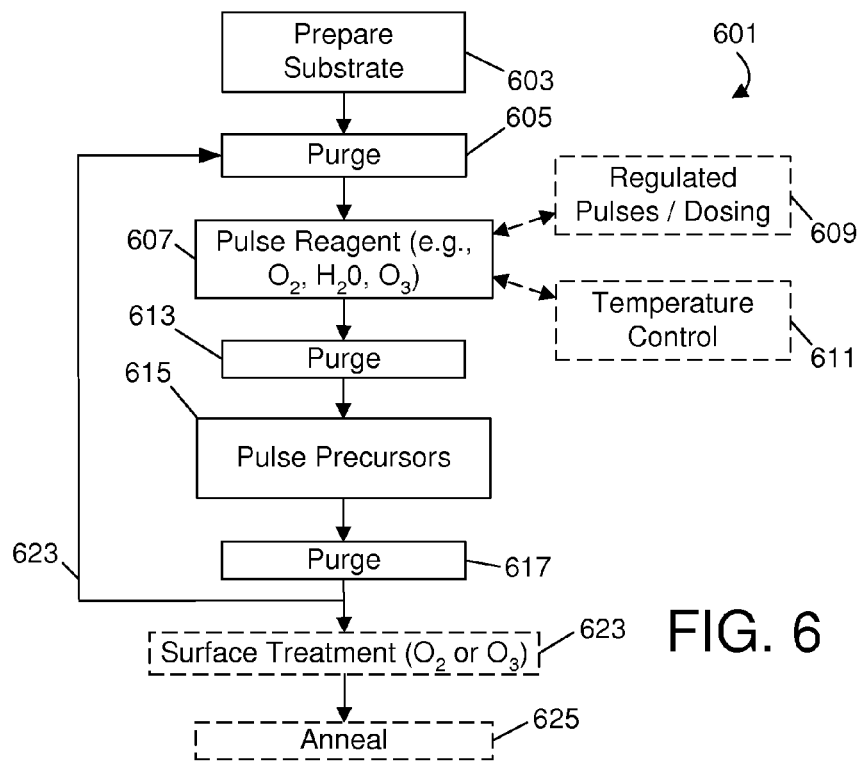
FIG. 6 shows a flowchart corresponding to the use of the chamber of FIG. 5. As indicated by dashed-line boxes 609 and 611, special processes (such as regulated use of the reagent and/or process temperature control) may be used to fabricate one or both of the metal oxide layers (e.g., a barrier layer and primary dielectric layer). In some embodiments, each metal oxide layer can be based in the same metal (e.g., zirconia), and one or both of the optional dashed-line processes may be used to fabricate the metal oxide layers such that (a) one layer can serve as a barrier layer to prevent reaction between the other metal oxide layer and a previously-deposited electrode, to effectively seal that electrode, and (b) the second metal oxide layer can subsequently be fabricated using more aggressive processes that help build a high-K material.

FIG. 6 illustrates the general ALD method, denoted by reference numeral 601. As indicated by block 603, a substrate may first be prepared and introduced into a clean room environment. The preparation steps may include any steps suitable to the substrate and other materials at issue, for example, as may be necessary to prepare for deposition of a first electrode on a substrate (e.g., via a wet or dry cleaning process). The substrate may include any material suitable for use in supporting a semiconductor layer, including metal, glass, some other insulator, or another material, conventional or otherwise; generally speaking, when fabricating a MIM stack for use as an electronic component (e.g., capacitor, DRAM cell), an electrode layer is first deposited or readied. For example, any of the processes mentioned earlier may be used to prepare an electrode surface for use as a suitable growth surface, with lattice matching properties. This surface may be crystallized via a RTP process, and if desired, "roughened" so as to increase effective capacitance. Once ready, the electrode surface may be cleaned or prepared. As mentioned, the preparation may also include a scrubbing step depending on exposed surface, to clean, oxidize and otherwise prepare the electrode surface.

Following preparation and pretreatment, the chamber is purged using a vacuum process, as indicated by function block 605. A reagent (such as oxygen gas, ozone gas, water vapor, or some other oxygen source) may then introduced to the chamber to adsorb to the surface of the substrate, per reference numeral 607; as alluded to above, the introduction of this reagent may overlap the scrubbing process, i.e., if ozone is used as the pretreatment agent and a vacuum is maintained, it may not be necessary to use further reagent for the first ALD cycle. Some designs may benefit from the use of regulated reagent pulses, separated if desired by a purge cycle. This process is indicated in FIG. 6 as a dashed-line (optional step) block 608. In this regard, regulated dosing may take the form of shorter pulses, lower concentration (e.g., ozone mixed with oxygen gas in a lower percentage), and so forth. If necessary, the chamber is then again purged, to leave only a conformal amount of the reagent on the top surface of the substrate, as indicated by block 609. One or more precursors are then introduced to the chamber to react with the oxygen source (e.g., for an exposure time of from one to ten seconds), as indicated by block 611, and the chamber is then again purged, per numeral 617, and the process is then repeated as necessary, per return path 621.

The cycle's result is a layer having a thickness on the order of a fraction of an Angstrom to a few Angstroms. Cycles may be then repeated as necessary to deposit any number of desired layers (e.g., forty times to produce a 2 nm thick dielectric layer for a hypothetical growth rate of 0.5 A/ALD cycle). When the dielectric layer of the appropriate thickness and metal electrode have been formed, the assembly can be subjected to an anneal or other treatment process in an oxygen-rich environment, identified by reference numerals 623 and 625, to further oxidize the fabricated film to fill remaining oxygen vacancies and reduce defects in the film.

FIGS. 7-10 are used to analyze the undesired formation of Ti—$O_x$—$N_y$, and to discuss process parameters for minimizing this formation.

Figure 7:
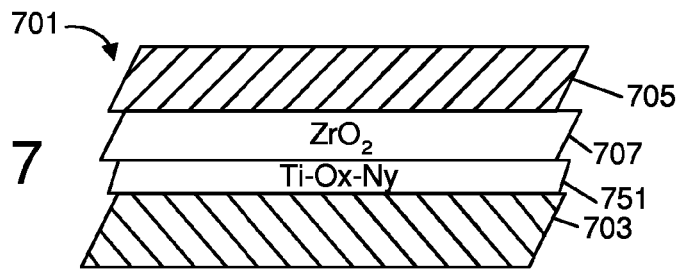
FIG. 7 illustrates a MIM stack 801 that does not have a barrier layer, and which consequently results in a thin region with mixed contribution of titanium ("Ti"), oxygen ("O") and nitrogen ("N"). This region can have both high leakage and low dielectric constant and thereby detract from device performance. A barrier layer, introduced in the FIGS. above, is used to help deter the formation of this "Ti—$O_x$—$N_y$," layer.

In particular, FIG. 7 shows a MIM stack 701 having first and second electrodes 703 and 705 where at least the bottom electrode includes TiN, and where a single dielectric layer 707 has been deposited. As previously mentioned, if high temperature and/or sufficiently reactive materials are used, the metal nitride in the electrode may be corrupted, and form a leaky, relatively low-K layer of Ti—$O_x$—$N_y$, 751. This layer in substantial quantities can sometimes be seen in electron microscope images as a white spot amorphous layer.

Figure 8:
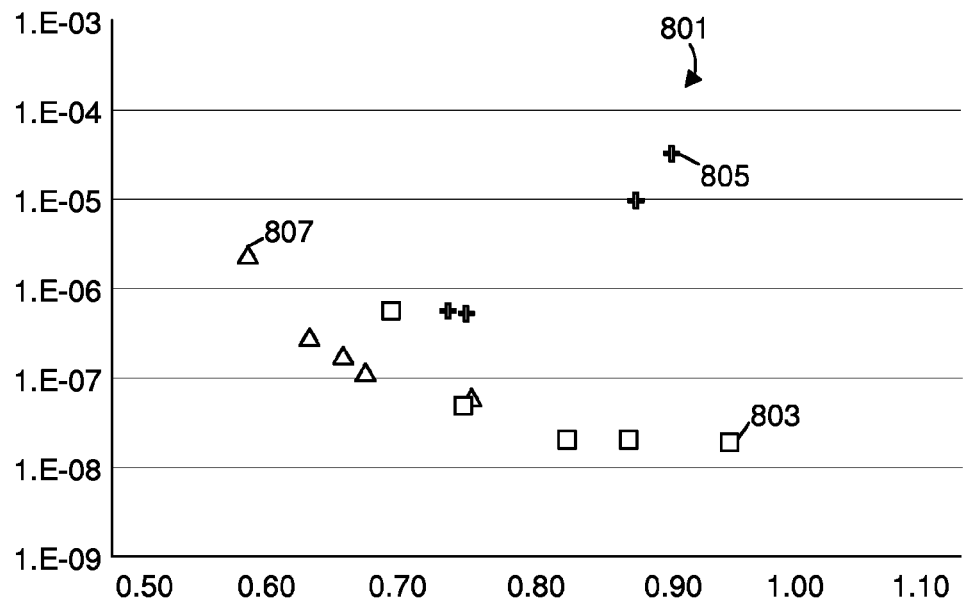
FIG. 8 provides a graph 801 that identifies experimental data for three different materials-process combinations. In particular, squares 803 denote data points for a 260 degree Centigrade ("° C.") process without a barrier layer, crosses 805 denote data points for a 300° C. process without a barrier layer, and triangles 807 denote data points for a 300° C. process with a barrier layer.

Data showing relative characteristics of such a device are presented in FIG. 8. A graph 801 identifies experimental data for three different materials-process combinations; squares 803 denote data points for a 260 degree Centigrade ("° C.") process without a barrier layer, crosses 805 denote data points for a 300° C. process without a barrier layer, and triangles 807 denote data points for a 300° C. process with a barrier layer. Comparing data for the barrier-less 260° C. and 300° C. processes, it is seen that they both yield an EOT (equivalent oxide thickness) greater than approximately 0.70 nm. The 300° C. process presents significantly higher leakage than the 260° C. process (e.g., generally greater than $10^{-6}$ A/cm$^2$ at 1.0 Volt, which is generally too high). What this data is believed to represent is that the higher temperature process of the two forms crystalline zirconia in greater quantities (with consequent higher dielectric constant), but that corruption of the electrode occurs on an increasing basis at such higher temperatures; in other words, while crystalline zirconia may be formed at higher temperatures, Ti—$O_x$—$N_y$ production effectively cancels out any benefits obtained from that crystalline form. As implied earlier, a dopant, such as aluminum oxide, can be added to help reduce leakage, but such addition suppress leakage at the expense of amorphous layer formation and the sacrifice of high-K characteristics, i.e., the dopant lowers dielectric constant. A 260° C. process with a barrier layer first deposited is depicted using the triangles 807, and this data generally indicates substantial EOT improvement (e.g., 050 nm<EOT<0.70 nm), at the expense of slightly higher leakage (e.g., L~$10^{-7}$ A/cm$^2$ at 1.0 Volt). With a dopant added to the barrier layer, or other process refinements, it is believed it is possible to reduce leakage to desired levels (generally L<$10^{-8}$ A/cm$^2$ at 1.0 Volt) while still maintaining or even further improving EOT.

Figure 9:
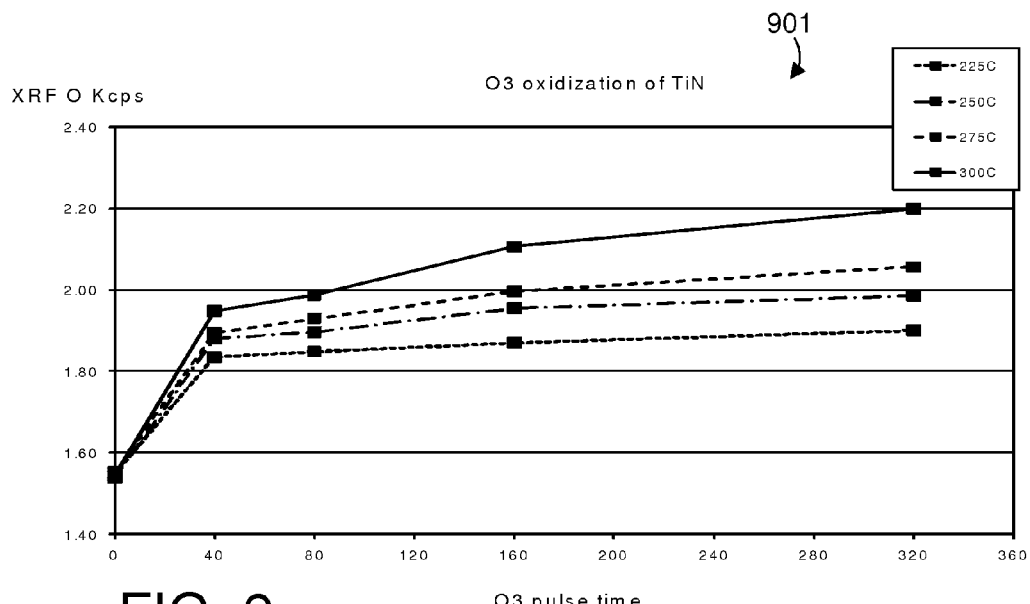
FIG. 9 provides a graph 901 that identifies TiN electrode oxidation at different ALD temperatures and ozone doses. The graph presents x-ray fluorescence (XRF) data for Ti—$O_x$—$N_y$ for four different fabrication temperatures (225°
Figure 10:
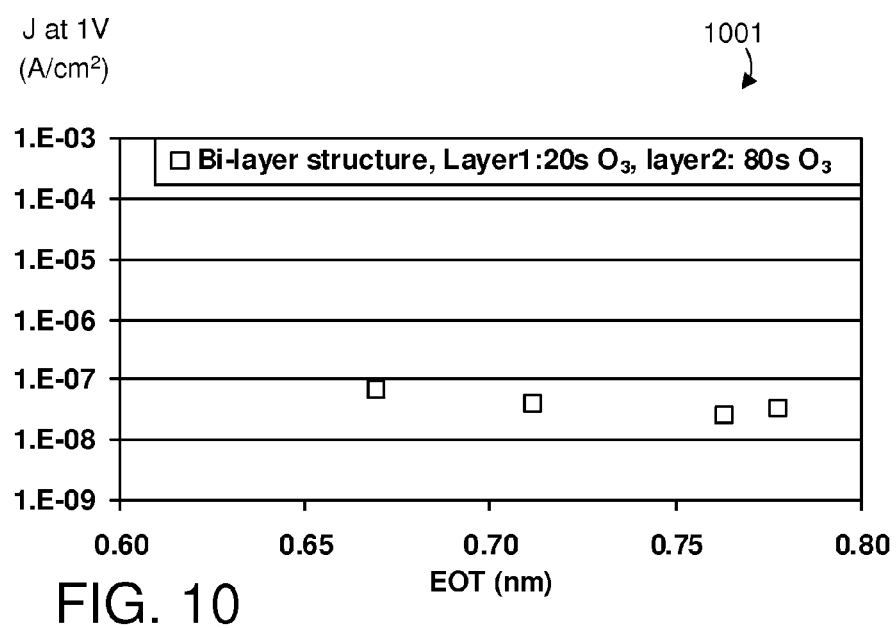
FIG. 10 provides a graph 1001 related to the use of low ozone dosing with the use of a barrier layer. In particular, small squares in FIG. 10 represent performance data for a device with a two metal oxide layers, including a zirconia-based barrier layer and a (high ozone reagent dosing) zirconia-based primary dielectric layer.

FIGS. 9 and 10 provide further data regarding oxidation of titanium nitride as a function of ozone reagent dosing. In particular, a graph 901 in FIG. 9 identifies data for four different process temperatures, 225° C., 250° C., 275° C. and 300° C., respectively. A left, vertical axis of the graph 901 represents X-ray diffraction peak data for Ti—$O_x$—$N_y$, which a bottom, horizontal axis represents ozone pulse time (e.g., assuming a consistent ozone concentration, e.g., 10% of a reagent gas). As seen in the graph, Ti—$O_x$—$N_y$ formation increases sharply with ozone concentration for low concentrations, and then substantially levels off for low temperatures (e.g., 225° C.); it continues to climb for higher temperatures (e.g., 300° C.). Ozone is a notoriously reactive oxygen source, and the data in FIG. 9 suggests that very low ozone dosing (e.g., less than 40 seconds pulse time) and low heat help minimize Ti—$O_x$—$N_y$ formation in a finished MIM stack.

Leakage and EOT data are presented in FIG. 10 for a two-layer device based on a TiN bottom electrode. In particular, a graph 1001 plots data relating to the use of low ozone dosing with the use of a barrier layer. Small squares in FIG. 10 represent performance data for a device with a low-ozone dosing zirconia-based barrier layer and a high-ozone zirconia-based dielectric layer, with an ALD process temperature of 260° C. Notably, the presented data indicates that a bilayer structure where high ozone dosing is used for the primary dielectric layer provides no noticeable degradation of EOT (and of dielectric constant) due to the higher ozone dosing. Thus, the presence of the barrier layer is effective to isolate the ozone from the TiN electrode. This isolation means that, as process temperatures increase, a zirconia layer with high crystalline contribution (e.g., from tetragonal or cubic zirconia) may be formed with minimization of TiN corruption from process materials (e.g., from the combination of ozone and high temperatures in the deposition environment).

Figure 11:
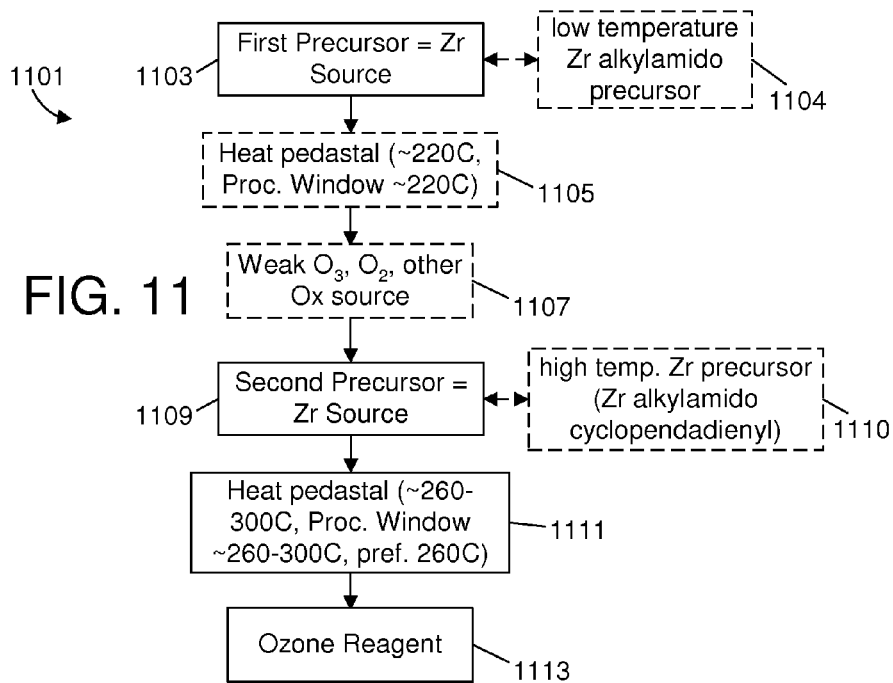
FIG. 11 shows an ALD process 1101 used to deposit two different zirconia-based metal oxide layers. Different temperature windows (and if desired different precursors) may be used to form each metal oxide layer to have a common primary layer, but each layer may have different structure. For example, one layer may be formed as a high-K layer, e.g., with a large contribution from tetragonal or cubic zirconia.

FIG. 11 provides additional detail regarding a specific process that may be used to produce high-K films where both a barrier layer and a primary dielectric layer are zirconia-based. In particular, as indicated by flow chart 1101 and first process step 1103, a first zirconium precursor is used to deposit monolayers that will form the barrier layer. Again, it has been found that a barrier layer of between 0.5 to 2.0 nm will provide suitable protection for the underlying electrode layer, depending on process and materials. As denoted by dashed-line block 1104, a low temperature Zr alkylamido-based precursor is one substance that may be used to deposit zirconia at a relatively low temperature window, that is, in a process where the barrier layer may be formed without corrupting the underlying electrode (e.g., an electrode rooted in a metal nitride, such as TiN). As further indicated by dashed line block 1105, a temperature window of around 220° C. (or otherwise sufficiently low to avoid electrode corruption, or substantial Ti—Ox-Ny formation in the case of TiN) may be applied during this process, for example, via pedestal heating as has previously been introduced. Weak ozone, or another, less reactive source of oxygen may also be used, in addition to or in lieu of this process window, per numeral 1107. For example, water, oxygen gas ($O_2$) or another source of oxygen may also be used, depending on process design and materials considerations. After the barrier layer is complete, the primary dielectric may then be deposited, e.g., as a second metal oxide layer. In the embodiment of FIG. 11, this may be based on the use of a second, different zirconium source, for example, a high temperature Zr precursor (such as Zr alkylamido cyclopendadienyl, as previously mentioned) or any of a variety of other Zirconium precursors to the extent such precursors facilitate formation of crystalline zirconia, or other high-K dielectrics. If a higher process temperature is used (e.g., a 260-300° C. temperature window), then pedestal heating may also be used for this process; in one embodiment, the high-K dielectric layer may be formed using a temperature of approximately 260° C., together with a (high dosage) ozone reagent. These process parameters are variously indicated in FIG. 11 by reference numerals 1109, 1110, 1111 and 1113.

Notably, the embodiment of FIG. 11 provides a method where two different zirconium precursors are used to deposit two metal oxide layers, one with (optionally) amorphous zirconia, the second with crystalline (or other high-K) zirconia. In such a device, the amorphous layer may be doped and characterized by a dielectric constant of less than 30, depending on process; by contrast, the high-K layer may be characterized by a dielectric constant above 35, e.g., 40 or higher. In other embodiments involving the use of zirconia for both layers, the same precursor may be used for both layers. In still other embodiments, one or both layers may be made using materials other than zirconium, e.g., using a different primary metal for the respective oxide layer, and with a common primary metal used for each respective layer if desired.

Figure 12:
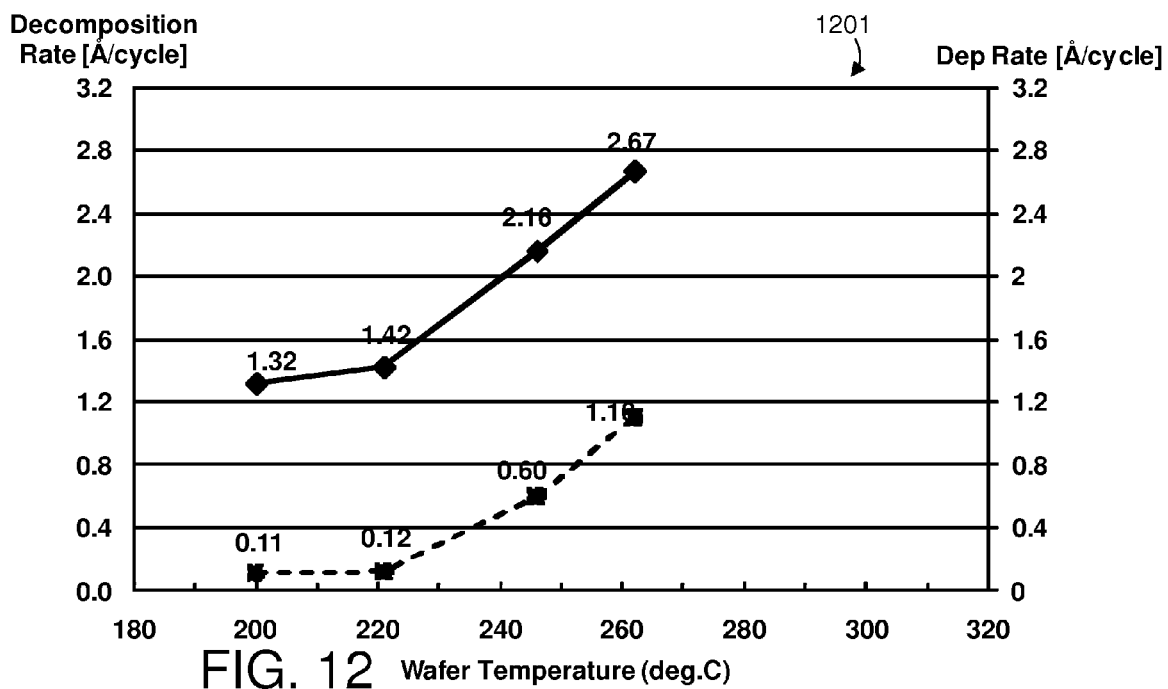
FIG. 12 provides a graph 1201 showing decomposition rate (dashed line) and deposition rate (solid line) for one zirconium precursor, in particular, a low temperature Zr alkylamido based precursor. Having a relatively low decomposition rate through about 220° C., a low temperature Zr precursor may be used in a low-temperature ALD process to fabricate a zirconia-based barrier layer, for example, to fabricate the zirconia-based barrier layer that was the subject of FIG. 11.
Figure 13:
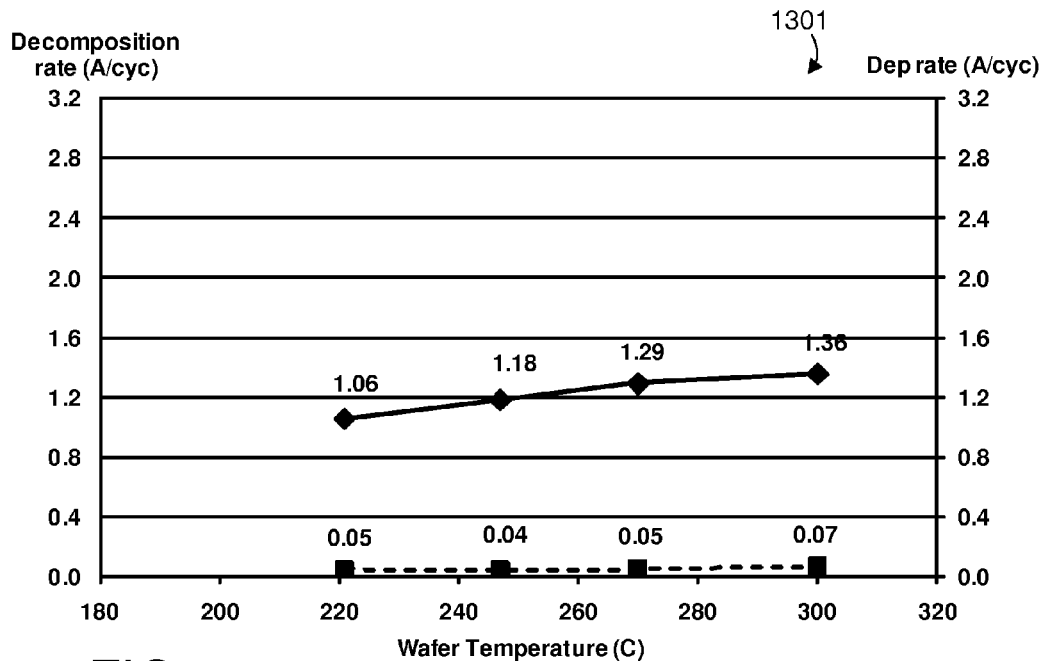
FIG. 13 provides a graph 1301 showing decomposition rate (dashed line) and deposition rate (solid line) for one zirconium precursor, namely, a high temperature zirconium precursor (such as Zr alkylamido cyclopendadienyl). This and similar "high temperature" zirconium precursors may be used to fabricate a crystalline zirconia-based oxide, e.g., cubic or tetragonal zirconium, or a mix of different crystalline phases (i.e., to provide relatively high dielectric constant).

FIGS. 12 and 13 provide graph data, 1201 and 1301, respectively, relating to the deposition rate and decomposition rate of low temperature Zr alkylamido-based precursors and high temperature Zr alkylamido cyclopendadienyl. As just indicated, in one embodiment, these two different zirconium sources may be used to deposit respective barrier layers and primary dielectric layers each rooted in the a zirconium-based metal oxide. As seen in FIG. 12, the low temperature Zr precursor begins to decompose (and become unstable) for temperatures above 220° C. (decomposition rate is the bottom curve in FIG. 12, while the upper curve represents deposition rate). With reference to FIG. 13, the high temperature Zr precursor remains stable through higher temperatures with no substantial decomposition either at 220° C., above 250° C., or through the "second" ALD process window of 260° C. through 300° C.

In the embodiment just presented, different zirconium precursors may be used as desired, based on cost, expense, deposition rate and other parameters. For example, while the high temperature Zr precursor "could" be used for a lower temperature window (e.g., to fabricate the barrier layer), the deposition rate of a high temperature Zr precursor at 220° C. is often considerably lower (e.g., more expensive) than for a low temperature Zr precursor; for this reason alone, it may be desired to employ two or more precursors to fabricate a MIM stack.

The processes and materials introduced above may be used to fabricate a MIM stack suitable for use in relatively small technologies. Using relatively low-K zirconia as a barrier layer (e.g., 0.5-2.0 nm thick), and using relatively high-K zirconia as a primary dielectric (e.g., 5-10 nm thick), a device having an effective dielectric constant approaching or greater than 40 may be produced, notwithstanding the use of a TiN layer. Because the use of metal nitride electrodes and zirconia represent relatively inexpensive process materials, it is believed these processes and devices facilitate low cost, high density MIM stack materials suitable for next generation levels of miniaturization.

With details of specific processes and devices thus presented, this disclosure will now present additional detail on the implementation of capacitors and DRAM cells and arrays based on the foregoing principles.

Figure 14:
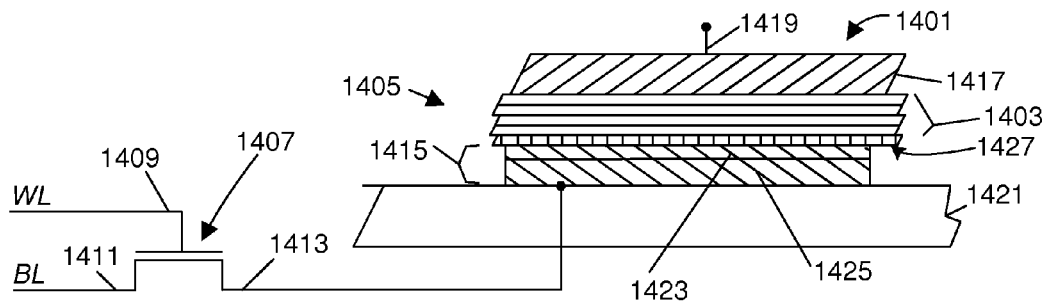
FIG. 14 is a diagram used to illustrate fabrication of a dynamic random access memory ("DRAM") cell according to the principles introduced herein.
Figure 15:
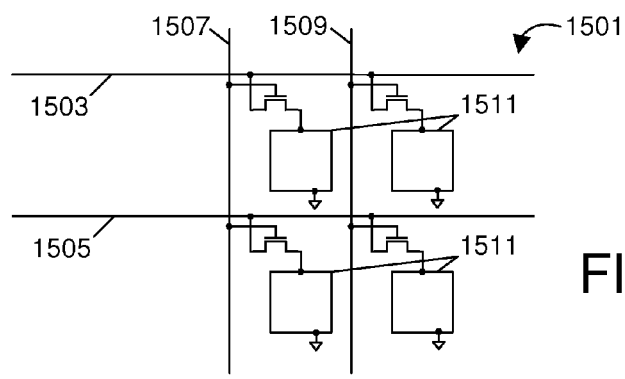
FIG. 15 shows an array of DRAM cells, made according to the technology presented herein.

As mentioned earlier, two specific applications of the principles discussed herein are to the fabrication of capacitors and to the fabrication of memory cells, including dynamic random access memory ("DRAM") cells (which form the basis for volatile memory in most contemporary computer systems). FIGS. 14 and 15 will be used for this initial discussion. DRAM memory cells use a capacitor to store charge for a period of time, with the charge being electronically "read" to determine whether a logical "one" or "zero" has been stored in the associated cell. Conventionally, a cell transistor is used to access the cell, i.e., the cell transistor is turned "on" in order to store data on each associated capacitor and is otherwise turned "off" to isolate the capacitor and preserve its charge. More complex DRAM cell structures exist, but this basic DRAM structure will be introduced below, for purposes of illustrating the application of the principles of this disclosure to capacitor manufacturing and to DRAM manufacturing. Following this introduction, several specific structures will be described, with reference to FIGS. 16-18.

FIG. 14 is used to illustrate one DRAM cell 1401, namely, one built using a primary dielectric layer 1403, expressed in this FIG. as a series of monolayers or nanolaminates. The cell 1401 is depicted to schematically include two principal components, including a cell capacitor 1405 and the cell transistor 1407 (seen at the left-hand side of FIG. 14). The cell transistor is usually constituted by a MOS transistor having gate 1409, source 1411 and drain 1413, the gate 1409 being connected to a word line ("WL") and one of the source 1411 and drain 1413, being connected to a bit line ("BL"); in this example, it is the source 1411 that is depicted as coupled to the bitline. The cell capacitor has a lower or storage electrode 1415 and an upper or plate electrode 1417; in this example, the storage electrode is connected to the other end of the cell transistor (i.e., to the drain 1413 in this example), such that the cell transistor acts as a switch for storing and destructively reading charge from the storage electrode and the plate electrode is coupled to a reference potential 1419 (e.g., ground). When selected for reading or writing, the cell transistor is turned "on" by an active level of the word line "WL" to access the storage electrode of the cell capacitor 1405 via the bit line "BL." The memory cell according to each of embodiments described below includes each of these basic elements, including a cell capacitor 1407, configured to have an insulating layer (e.g., a dielectric layer) 1403 sandwiched between two metal electrodes (e.g., storage and plate electrodes, 1415 and 1417).

As was introduced earlier, the cell capacitor 1407 is fabricated by initially depositing a bottom electrode (e.g., storage electrode 1415) upon a substrate 1421 using one of many well-known processes. This electrode is either primarily made from, or includes a layer 1423 primarily made from, a reactive material such as metal titanium nitride (TiN), with a base layer 1425 beneath the reactive material layer as appropriate to the design. A barrier layer 1427 is deposited during capacitor formation above the reactive layer, so as to prevent reaction between the reactive material and a "high-K" dielectric or other material or process beneficially used to obtain good capacitor performance. As mentioned earlier, the material used for this barrier layer can be a metal oxide having the same metal (e.g., zirconium) that forms the primary metal for the dielectric (or second metal oxide layer 1403), deposited using a low temperature window or conventional process (e.g., formed as amorphous zirconium oxide). For example, a low temperature Zr alkylamido-based precursor may be used as part of a first "low temperature" ALD process window to fabricate this barrier layer, if desired, also bolstered by restricted ozone usage or usage of a different oxygen source. The barrier layer may be made to be thin, just thick enough to be effective at deterring later reaction of the metal nitride with materials used to fabricate the high-K layer 1403, and so in one embodiment, is no more than about 2.0 nm in median thickness. Through the use of the barrier layer, a subsequently-deposited "high-K" layer may be fabricated, using materials that might otherwise react with the electrode (e.g., the processes may employ high ozone dosage and/or high fabrication temperatures that, without the presence of the barrier layer, might degrade device performance).

Irrespective of specific process or materials, the bottom or storage electrode 1415 is used to selectively store charge to represent a logic state, i.e., it is normally electrically isolated from other components and is accessed using the cell transistor 1405. The dielectric layer 1403 helps maintain an electric field between this plate and the second conducting layer or plate electrode 1417, which may be connected to ground. As with the case with each of the embodiments herein, depictions are drawn to explain principles only, and should not be understood to denote relative sizes.

The cell transistor 1407 receives two inputs, respectively representing column and row selection lines used to access a matrix of DRAM cells (not shown in FIG. 14). In particular, activation of a column select signal via wordline "WL" causes the transistor to conduct, and to electrically couple the bitline "BL" with a drain terminal 1413 of the cell transistor, to connect the row selection line to the storage electrode 1415 of the cell capacitor. As is known, the bitline "BL" may be coupled to this conducting layer either to provide charge for storage purposes, or to "sense" the stored value of the capacitor. As is typical with DRAM devices, the cell capacitor retains charge only for a short amount of time and refresh procedures may be used if it is desired to retain charge for any significant period.

DRAM technology is relatively cheap to manufacture and usually allows a significant density to be achieved, which are primary reasons why DRAM technology is so commonly used in contemporaneous computer and other digital systems. By enabling a greater dielectric constant to be achieved, and thinner dielectric layers to be used, the principles provided by this disclosure facilitate even smaller and cheaper memory cells.

FIG. 15 illustrates a memory array 1501 formed of DRAM cells, where each cell may be (for example) identical to the cell 1401 presented in FIG. 14. While only four such cells 1511 are illustrated in FIG. 15, it should be understood that a great many cells would typically be presented on a memory device, e.g., millions. Each memory cell 1511 is accessed by a particular combination of row selection line (1503 or 1505) with column selection line (1507 and 1509); while only four address lines have been presented in FIG. 15, a great many more will typically be presented (e.g., 64 columns for memory devices that utilize a 64-bit wide parallel data bus, and a much larger number of row selection lines).

FIGS. 16-18 respectively illustrate memory cells 1601, 1701 and 1801, each illustrating different capacitor configurations. Each memory cell 1601, 1701 and 1801 is formed on a semiconductor substrate 1605, 1705 or 1805, for example, a silicon substrate. Above this substrate, a source or drain region of a cell transistor (1611, 1711 or 1811) is selectively formed. It should be noted that the gate and the other of the source and drain of the cell transistor are omitted in order to avoid the complexity of the drawings. It should be further noted that other memory cells and word and bit lines as well as memory control circuits are also not shown for the same purpose. Each cell capacitor 1621, 1721 or 1821 is formed over the substrate and is connected to the cell transistor region 1607, 1707 or 1807 through a contact plug (1619, 1719 or 1819), formed selectively in an interlayer insulating film 1617, 1717 or 1817 on the substrate. The contact plug may be made of poly-silicon and/or metal such as Tungsten, and the interlayer insulating film may be made of silicon oxide. Each capacitor 1621, 1721 or 1821 is further connected to reference potential wiring 1631, 1731 or 1831. The cell transistor of each of the memory cells is generally the same for FIGS. 16-18 and may be constituted by any one of a planer type, a recess type, a pillar type, a fin type and any other types. However, the configuration of the storage capacitors is different for each of these FIGS.; the memory cell of FIG. 16 includes a cylinder-shaped capacitor 1621, while the memory cells of FIGS. 17-18 are respectively depicted to include a pillar-shaped capacitor 1721 and a crown-shaped capacitor 1821.

FIG. 16 illustrates a memory cell 1601 having a cylinder-shaped capacitor 1621. The capacitor 1621 has cylindrical electrodes 1623 and 1627 surrounding a dielectric layer 1625. The electrodes 1623 and 1627 and dielectric layer 1625 may be formed of the materials described herein using the processes described herein; for example, the electrodes may contain a reactive metal such as titanium nitride, with a barrier layer at the interface between the dielectric 1625 and either electrode 1623 or 1627. [As implied, because it is desired to avoid use of materials that might react with TiN or another conductor material, the barrier layer is typically used after a first electrode has been deposited, and prior to the deposition of the primary dielectric; a barrier may also be used after the second electrode has been deposited if the capacitor 1621 is to be subjected to additional fabrication processes that might expose the second conductor to other reactive materials, e.g., other ozone processes.]

As an example of a general process for forming a cylinder-shaped capacitor, an etching stopper film 1622 such as silicon nitride is formed on the interlayer insulating film 1617, followed by another insulating film 1624 such as silicon oxide. The film 1624 is used to determine the height of the cell capacitor 1601. Selective etching is performed on the insulating film 1624 and the stopper film 1622 to form a cylinder hole. The upper surface of the contact plug 1619 is thereby exposed. A conductive layer is then deposited inside of the cylinder hole and on the upper surface of the contact plug 1619, followed by further selective etching, such that the lower or storage electrode 1623 is formed. The electrode may be formed to include titanium nitride or a similar "reactive" material as has previously been discussed. If desired, a pretreatment process may then be utilized so as to increase effective capacitive plate area (or a work function enhancement layer may be deposited. The dielectric layer 1625 is formed on the storage electrode 1623 and the upper surface of the insulating film 1624, above a barrier layer 1626. The upper or plate electrode 1627 and the wiring 1631 are thereafter formed above the primary dielectric layer 1625 to complete the cylinder type cell capacitor. If desired, additional processes can be utilized for the interface between the dielectric layer and the upper electrode, though this is not required.

FIG. 17 illustrates a memory cell 1701 using a pillar- or pedestal-shaped capacitor 1721. The capacitor 1721 includes a pillar-shaped bottom electrode 1723, a dielectric layer 1725, and a top electrode 1727. The barrier layer 1726, the primary dielectric layer 1725 and top or plate electrode 1727 are deposited to conform with the pillar-shaped bottom electrode 1723. As with the capacitor from FIG. 16, the electrodes 1723 and 1727, the barrier layer 1726 and the dielectric layer 1725 may be formed of the materials and/or the processes described herein.

As an example of a general process for forming a pillar-shaped capacitor, a metal pad 1726 such as tungsten is selectively formed to cover the upper surface of the contact plug 1719, followed by an insulating layer (not shown) deposited over the entire surface. Thereafter, a capacitor hole for each memory cell is formed in the insulating layer by selective etching, and a conductive layer is then deposited over the insulating layer to fill each capacitor hole. The CMP (Chemical Mechanical Polishing) method is then performed on the conductive layer thus deposited, so that the pillar electrode 1723 for each memory cell is formed. Here also, the roughening and/or pretreatment processes may be employed as has been previously introduced. After removing the insulating layer, the barrier layer and dielectric layer are formed on each pillar electrode 1723 and the insulating film 1717, followed by the upper electrode 1727 and the wiring 1731. The pillar type cell capacitor is thus formed.

FIG. 18 illustrates a memory cell 1801 using a crown-shaped capacitor 1821. The capacitor 1821 includes a crown-shaped bottom electrode 1823, a barrier layer 1826, a dielectric layer 1825, and a top electrode 1827. The barrier layer 1826, the dielectric layer 1825 and the top electrode 1827 conform to the crown shape of the bottom electrode 1823. As with the capacitor from FIG. 16, the electrodes 1823 and 1827, the barrier layer 1826 and the dielectric layer 1825 may be formed of the materials and/or the processes described herein.

The methodology for forming a crown-shaped capacitor may be similar to that depicted in and described with reference to FIG. 16, i.e., a lower or storage electrode for each memory cell can be first formed using an etching stopper and an interlayer insulating film (see, e.g., elements 1622 and 1624 of FIG. 16). The insulating film is then, however, removed. As depicted in FIG. 18, a barrier layer 1826 and then a dielectric layer 1825 can be deposited above the lower or storage electrode 1823, to form the crown shape. The upper or plate electrode 1827 and the wiring 1831 are then formed to complete the formation of the crown-shaped cell capacitor.

Although cylinder-, pillar-, and crown-shaped storage capacitors are described above, it is understood that these descriptions are given only as examples, and that the materials and processes described herein can be used to form any style of type of memory storage device.

What has been described are methods of fabricating a semiconductor assembly that can be used as part of a capacitive device, memory device or similar structure. Specific structures and materials have been presented for use as dielectric and barrier layers, enabling smaller and more efficient capacitors, memory devices and other structures to be constructed, characterized by high dielectric constant and excellent leakage characteristics. While not limited to the use of these materials, specific manufacturing processes have also been presented, including the use of processes that facilitate the growth of high-K dielectric metal oxide forms for use as a dielectric, e.g., the growth of crystalline phase $ZrO_2$ and/or the suppression of $Ti-O_x-N_y$, leading to improved device characteristics. Other applications will readily occur to those having skill in the art in view of the teachings provided above, or in view of the invention defined by the claims set forth below.

In addition, while not specifically claimed in the claim section, the applications reserve the right to include in the claim section at any appropriate time the following methods and apparatuses.

XX. A device, comprising: a first electrode; a second electrode; a first metal oxide layer between the first electrode and the second electrode; and a second metal oxide layer between the first metal oxide layer and the second electrode, the second metal oxide layer forming a zirconia-based dielectric above the first electrode and the second electrode; where the second metal oxide layer has a higher dielectric constant than the first metal oxide layer.

XX+1. The device of clause X, where the first metal oxide layer is also zirconia-based.

XX+2. The device of clause X, where the first metal oxide layer has a median thickness of between approximately 0.5 nm and 2.0 nm.

XX+3. The device of clause X, where the first metal oxide layer is in contact with the first electrode, and where the second metal oxide layer is in contact with the first metal oxide layer.

XX+4. The device of clause X, where the first electrode includes a metal nitride.

XX+5. The device of clause XX+4, where each of the first electrode and the second electrode include titanium nitride.

XX+6. The device of clause XX+5, where the first metal oxide layer consists substantially of un-doped zirconium oxide, or zirconium oxide doped with one of aluminum, germanium, yttrium or magnesium.

XX+7. The device of clause XX, where the first metal oxide layer is substantially amorphous.

XX+8. The device of clause XX, embodied as at least one dynamic random access memory cell.

YY. A semiconductor component, comprising: a first electrode that includes a metal nitride; a second electrode; a first metal oxide layer between the first electrode and the second electrode; and a second metal oxide layer between the first metal oxide layer and the second electrode; where the first metal oxide layer has a lower dielectric constant than the second metal oxide layer, and where the first and second metal oxide layers have a common primary metal.

YY+1. The semiconductor component of clause YY, where the second metal oxide layer is substantially crystalline.

YY+2. The semiconductor component of clause YY+1, where the common primary metal is zirconium.

YY+3. The semiconductor component of clause YY, where the second metal oxide layer consists substantially of a zirconium-based oxide.

YY+4. The semiconductor component of clause YY+3, where: the metal nitride is titanium nitride; and the semiconductor component contains no substantial quantity of oxidized titanium nitride.

YY+5. The semiconductor component of clause YY+4, where the first metal oxide layer has a median thickness of less than approximately 2.0 nanometers.

YY+6. The semiconductor component of clause YY+5, where the first metal oxide layer includes consists substantially of a zirconia-based oxide.

YY+7. The semiconductor component of clause YY+6, where at least one of the first metal oxide layer or the second metal oxide layer is doped with one of aluminum, germanium, yttrium or magnesium.

YY+8. The semiconductor component of clause YY, where the first electrode, the second electrode, the first metal oxide layer and the second metal oxide layer form a capacitor.

YY+9. The semiconductor component of clause YY+8, where the capacitor is one of cylinder shaped, pillar shaped or crown shaped.

YY+10. The semiconductor component of clause YY+9, embodied as a memory cell.

YY+11. The semiconductor component of clause YY+9, further comprising multiple instances of the first electrode, the second electrode, the first metal oxide layer and the second metal oxide layer, each instance forming part of a memory cell, said semiconductor component embodied as an array of memory cells.

YY+12. The semiconductor component of clause YY+11, embodied as an integrated circuit dynamic random access memory device.

YY+13. The semiconductor component of clause YY, where the second metal oxide layer has a thickness at least four times greater than the first metal oxide layer.

YY+14. The semiconductor component of clause YY, where: the first metal oxide layer is characterized by a dielectric constant of no greater than approximately 30; and the second metal oxide layer is characterized by a dielectric constant of no less than approximately 35.

ZZ. A semiconductor component comprising at least one memory cell, each memory cell having: a first electrode having a metal nitride; a second electrode; a zirconia-based layer between the first and second electrodes to act as a dielectric; and a metal oxide layer between the zirconia-based layer and the first electrode, the zirconia-based layer having a higher dielectric constant than the metal oxide layer.

ZZ+1. The semiconductor component of clause ZZ, the at least one memory cell comprising a multitude of dynamic random access memory cells.

ZZ+2. The semiconductor component of clause ZZ+1, embodied as an integrated circuit device.

ZZ+3. The semiconductor component of clause ZZ+1, where the metal oxide layer has a median thickness of less than approximately 2.0 nanometers and is substantially amorphous.

ZZ+4. The semiconductor component of clause ZZ+3, where the metal oxide layer is also zirconia-based and is doped with one of aluminum, germanium, yttrium or magnesium.

ZZ+5. The semiconductor component of clause ZZ, where the first electrode, the second electrode, the zirconia-based layer, and the f metal oxide layer are formed as a non-planar layer stack.

XY. An integrated circuit memory device comprising an array of dynamic random access memory cells, each memory cell having: a first electrode having a titanium nitride; a second electrode; a zirconia-based layer between the first and second electrodes to act as a dielectric; and a metal oxide layer between the zirconia-based layer and the first electrode, the substantially amorphous metal oxide layer having a median thickness of less than two nanometers and characterized by no substantial titanium presence.

XY+1. The integrated circuit memory device of clause XY, where the zirconia-based layer is substantially crystalline.

XY+2. The integrated circuit memory device of clause XY, where the metal oxide layer is substantially composed of amorphous zirconia.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

We claim:

1. A method of fabricating a semiconductor layer assembly, the method comprising:
    depositing a first metal oxide layer above an electrode,
        the first metal oxide layer comprises zirconium oxide and having a first crystalline form,
        wherein the first metal oxide layer is deposited using a first oxygen reagent at or below 220 degrees centigrade; and
    depositing a second metal oxide layer using a second oxygen reagent on the first metal oxide layer,
        the second metal oxide layer comprises zirconium oxide and having a second crystalline form different from the first crystalline form,
        wherein the second oxygen reagent is more reactive than the first oxygen reagent.

2. The method of claim 1, wherein the depositing of the second metal oxide layer occurs at a temperature above 220 degrees centigrade.

3. The method of claim 1, wherein the first metal oxide layer has a median thickness of between 0.5 nanometers and 2.0 nanometers.

4. The method of claim 1, wherein the electrode consists of a metal nitride.

5. The method of claim 4, wherein the metal nitride is titanium nitride.

6. The method of claim 1, wherein the first metal oxide layer further comprises one of aluminum, germanium, yttrium, or magnesium.

7. The method of claim 1, wherein each of the depositing the first metal oxide layer and the depositing the second metal oxide layer is performed using atomic layer deposition.

8. The method of claim 1, wherein the oxygen reagent comprises ozone.

9. The method of claim 8, wherein the first oxygen reagent comprises ozone, and wherein a concentration of the ozone in the first oxygen reagent is less than a concentration of the ozone in the second oxygen reagent as the reagent.

10. The method of claim 1, wherein the second metal oxide layer is deposited at or above 260 degrees centigrade.

11. The method of claim 1, wherein the first crystalline form is amorphous and wherein the second crystalline form is one of cubic or tetragonal.

12. The method of claim 1, wherein the first metal oxide layer is deposited using a first metal precursor, and wherein the second metal oxide layer is deposited using a second metal precursor different from the first metal precursor.

13. The method of claim 12, wherein the first metal precursor comprises an alkylamido-based precursor and wherein the second metal oxide layer comprises alkylamido cyclopendadienyl.

14. The method of claim 12, wherein the first metal precursor decomposes at a lower temperature than the second metal precursor.

15. The method of claim 1, wherein the first metal oxide layer consists substantially of zirconium oxide.

16. The method of claim 1, wherein substantially no oxygen is introduced into the electrode during depositing the first metal oxide layer above the electrode.

17. The method of claim 1, wherein the first metal oxide layer directly interfaces the electrode.

18. The method of claim 1, wherein the second metal oxide layer is at least four times thicker than the first metal oxide layer.

19. The method of claim 1, wherein the second oxygen reagent comprises water.

20. The method of claim 1, wherein the first metal oxide layer comprises a first dopant having a first concentration, and wherein the second metal oxide layer comprises a second dopant having a second concentration lower than the first concentration.

* * * * *